(12) United States Patent
Fujimoto

(10) Patent No.: US 7,557,493 B2
(45) Date of Patent: Jul. 7, 2009

(54) VIBRATOR MODULE

(75) Inventor: Katsumi Fujimoto, Toyama (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 12/186,192

(22) Filed: Aug. 5, 2008

(65) Prior Publication Data

US 2008/0284282 A1    Nov. 20, 2008

Related U.S. Application Data

(63) Continuation of application No. PCT/JP2007/050938, filed on Jan. 23, 2007.

(30) Foreign Application Priority Data

Feb. 10, 2006  (JP) .............................. 2006-034269

(51) Int. Cl.
*H01L 41/053* (2006.01)

(52) U.S. Cl. .............. 310/349; 310/340; 310/344; 310/348; 310/370

(58) Field of Classification Search .......... 310/320, 310/340, 344, 346, 348, 349, 370
See application file for complete search history.

(56) References Cited

U.S. PATENT DOCUMENTS 4,471,259 A * 9/1984 Stoermer et al. ............ 310/353
5,449,965 A * 9/1995 Tsuru ........................ 310/351
5,589,724 A * 12/1996 Satoh et al. ................ 310/348

FOREIGN PATENT DOCUMENTS

| JP | 11-330893 A | 11/1999 |
| JP | 2000-216658 A | 8/2000 |
| JP | 2000-252786 A | 9/2000 |
| JP | 2002-198739 A | 7/2002 |
| JP | 2004-072641 A | 3/2004 |
| JP | 2005-333658 A | 12/2005 |

OTHER PUBLICATIONS

Junji Tani et al.; "Relief of Stress Concentration around the Edges of Electrodes on Piezoelectric Device"; Journal of the Japan Society of Applied Electromagnetics and Mechanics, Japan, vol. 6, No. 2, (1998), pp. 157-162.
Written Opinion of the International Searching Authority (PCT/ISA/237) of International Application PCT/JP2007/050938, date of mailing Aug. 27, 2007 (in Japanase and English translation).

* cited by examiner

*Primary Examiner*—Thomas M Dougherty
(74) *Attorney, Agent, or Firm*—Dickstein, Shapiro, LLP.

(57) ABSTRACT

A vibrator module includes a frame having an outer frame and an inner frame. A vibrator unit is formed inside the inner frame. The frame and the vibrator unit are formed of a piezoelectric ceramic or the like as one piece. On one side of the vibrator unit, an IC is mounted so that a hollow portion is provided between the vibrator unit and the IC. The periphery of the IC is filled with a resin material. On the other side of the vibrator unit, a top cover serving as a sealing material is mounted so that a hollow portion is provided between the vibrator unit and the top cover.

15 Claims, 9 Drawing Sheets

VIBRATOR MODULE

CROSS REFERENCE TO RELATED APPLICATIONS

The present application is a continuation of International Application No. PCT/JP2007/050938, filed Jan. 23, 2007, which claims priority to Japanese Patent Application No. JP2006-034269, filed Feb. 10, 2006, the entire contents of each of these applications being incorporated herein by reference in their entirety.

FIELD OF THE INVENTION

The present invention relates to vibrator modules. More particularly, the present invention relates to a vibrator module, such as an oscillation module, a time module, or a sensor module, in which a piezoelectric vibrator and an IC are used in combination.

BACKGROUND OF THE INVENTION

As a vibrator module in which a piezoelectric vibrator and an IC are used in combination, for example, an oscillation module that oscillates a piezoelectric vibrator at a resonance point to output a clock, a time module, a voltage-controlled oscillator (VCO), a TCXO module in which an EEPROM or the like is mounted and which corrects frequency-temperature characteristics specific to a vibrator, and so forth are commercially available. As another vibrator module, an angular velocity sensor is available, in which, in order to detects a change in vibration state caused by an angular velocity of rotation of a piezoelectric vibrator, a driving circuit that drives the piezoelectric vibrator and a detection circuit for detecting a signal corresponding to a Coriolis force are used in combination. Additionally, an acceleration sensor is available, which detects a change in oscillation frequency in a case in which a vibrating reed of a piezoelectric vibrator receives a stress caused by acceleration. Furthermore, a gas sensor is available, in which a material that absorbs moisture or gas is applied to a surface of a piezoelectric vibrator, and which detects a change in oscillation frequency caused by the absorption concentration of moisture or gas.

As such a vibrator module in which a piezoelectric vibrator and an IC are used in combination, as shown in FIG. 18, a vibrator module in which a vibrator and an IC are embedded in a package is provided. A vibrator module 1 includes a package 2, and an IC 3 is accommodated in the package 2. The IC 3 is bonded to bumps formed on the package 2 by ultrasonic thermal compression bonding or the like. A crystal strip 4 serving as a vibrator is supported by steps of the package 2, and bonded to a crystal-receiving terminal using a conductive adhesive or the like. An opening of the package 2 is covered with a cover 5. The vibrator module 1 is mounted on a circuit board or the like using mounting terminals 6 that are formed on the bottom surface of the package 2.

The size of the vibrator module 1 can be reduced to some content. However, because the IC 3, the crystal strip 4, the cover 5, and so forth need to be bonded to the package 2, the bounding cost becomes high. Additionally, because the package structure becomes complicated, that is not preferable to cost reduction and size reduction.

For this reason, as shown in FIG. 19, a vibrator module 8 has been invented, in which the crystal strip 4 is accommodated in the package 2, in which the IC 3 is disposed above the crystal strip 4, in which the package 2 is air-tightly sealed, and in which a resin 7 is applied onto the IC 3. Because, in the vibrator module 8, the IC 3 serves as a cover, the size of the vibrator module 8 can be more reduced (see Patent Document 1).

Patent Document 1: Japanese Unexamined Patent Application Publication No. 2004-72641

However, even in a case of the vibrator module shown in FIG. 19, a problem that bonding cost for bonding the crystal strip serving as a vibrator to the package is increased has not been solved. Additionally, because of the configuration in which the crystal strip and the IC are bounded to the package, there is also a problem that the cost of the package is relatively increased.

In the related art, manufacturing cost of vibrator modules depended on the size of vibrators. In other words, the number of pieces of vibrators that were obtained from one wafer determined the cost of the vibrators. The size of packages was determined in correspondence with the size of vibrators. However, recently, designs capable of reducing the cost of vibrators have been advanced, resulting in a decrease in the size of vibrators. In such a case, a factor in determining the size of vibrator modules has depended on the size of IC chips more than that of vibrators.

Particularly, because an MEMS technology or the like has been developed, it has been possible to manufacture vibrators less than or equal to 1 mm per side. As a result, the tendency has been more increased.

Furthermore, as the size of vibrators is reduced and the packaging density of ICs is increased, the size of vibrator modules is more reduced. In such a case, in the cost of vibrator modules, the cost of precision packages tends to be relatively increased, which is different from a case of large size products manufactured when vibrators and ICs were expensive. Moreover, a problem with a space in which each vibrator is bonded to a package using an adhesive has to be also dealt with in order to reduce the size of vibrators.

SUMMARY OF THE INVENTION

Accordingly, it is an object of the present invention to provide a vibrator module in which a vibrator does not need to be bonded to a package and which is compact and inexpensive.

A vibrator module according to the present invention includes the following elements: a frame and a vibrator unit that is formed of a piezoelectric ceramic and that has an electrode, the vibrator unit being formed inside the frame so as to be integral with the frame; and an IC mounted in the frame with the vibrator so that a hollow portion is formed between the IC and the vibrator unit. The electrode of the vibrator unit and the IC are electrically connected to each other.

Since the vibrator unit, which is formed of a piezoelectric ceramic and includes the electrode, and the frame are formed as one piece, the frame with the vibrator can be used as a package in which a vibrator is formed in advance. Accordingly, no process of bonding a vibrator to a package is necessary. Additionally, since the IC is mounted in the frame with the vibrator, the vibrator module in which the vibrator and the IC are accommodated in one package can be obtained. In this case, since the hollow portion is formed between the vibrator unit and the IC, a region in which the vibrator unit can vibrate can be ensured.

Since the vibrator unit is formed of a piezoelectric ceramic, a region in which the vibrator is confined can be formed by molding to determine the size and form of the region. Additionally, a polarization region of the vibrator unit can be freely set.

In the vibrator module, the frame may be formed of a dielectric ceramic, and, in such a case, a portion between the vibrator unit and the frame may be formed of a functionally gradient material.

Since the portion between the vibrator unit and the frame is formed of a functionally gradient material, the vibrator unit can be formed as a piezoelectric ceramic, and the frame can be formed of a dielectric ceramic. Accordingly, the vibrator module can be connected to an external circuit at the frame portion which is formed of a dielectric ceramic having a strength higher than a piezoelectric ceramic.

Furthermore, a terminal that is electrically connected to the electrode of the vibrator unit is formed on the frame, and the terminal and the IC are bonded by flip-chip bonding or wire bonding.

In order that the IC is mounted in the frame and that the IC and the vibrator are electrically connected to each other, the IC is connected to the terminal formed on the frame. In this case, the terminal, which is formed on the frame, and the IC may be bonded by flip-chip bonding or wire bonding.

Moreover, the IC may be disposed on one side of the vibrator unit, and, on the other side of the vibrator unit, a sealing material with which the vibrator unit is sealed may be formed in the frame with the vibrator so that a hollow portion is formed between the sealing material and the vibrator unit.

The IC is disposed on one side of the vibrator unit, and the other side of the vibrator unit is sealed with the sealing material. Thus, the vibrator module in which both sides of the vibrator unit are sealed can be obtained. In this case, although a hollow portion is formed on the IC side, another hollow portion is also formed between the vibrator unit and the sealing board. Therefore, a region in which the vibrator unit can vibrate can be ensured.

According to the present invention, the vibrator module can be obtained, in which the vibrator unit and the frame are formed as one piece, and in which an individual vibrator does not need to be bonded to a package. In other words, the frame with the vibrator, in which the vibrator unit and the frame are formed as one piece, is used as a package, and the IC is mounted in the frame with the vibrator, whereby the compact and inexpensive vibrator module can be obtained.

Because the region in which the vibrator is confined can be formed by molding to determine the size and form of the region, vibration leakage from the vibrator unit can be reduced, and stable vibration can be obtained. Additionally, because the polarization region of the vibrator unit can be freely set, the electromechanical coefficient can be adjusted by changing the polarization region. Accordingly, different performances can be obtained even when vibrator units are formed of the same material.

Particularly, when a plate vertically vibrates in the thickness direction, a region in which the plate can vibrate needs to have a length more than or equal to ten times the thickness of the plate. For this reason, there was a problem that the shape of low-frequency (1 MHz to 20 MHz) vibrations having a large thickness becomes large. Accordingly, for example, in a case of crystal vibrators or the like, a process needed to be added, in which barrel polishing or the like was performed so that the periphery could be made thinner for size reduction. However, according to the present invention, the size of vibrators can be easily reduced using a mold, thereby contributing to the size reduction of low-frequency vibrators.

The above and other objects, characteristics, and advantages of the present invention will become more apparent from the following description of the preferred embodiments with reference to the drawings.

Figure 1:
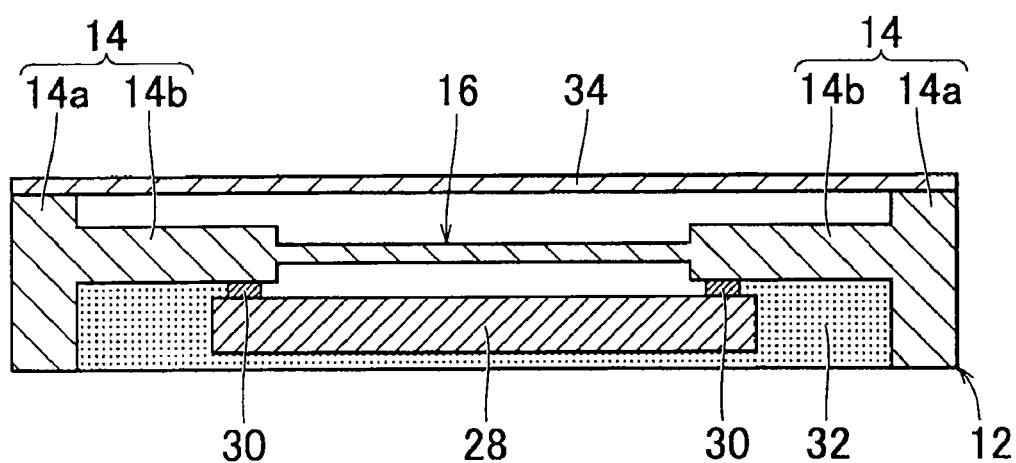
FIG. 1 is a cross-sectional view of a vibrator module according to the present invention, showing the vibrator module as one example.

REFERENCE NUMERALS 10 vibrator module
12 frame with a vibrator
14 frame
16 vibrator unit
18 vibrating body
20a, 20b electrodes
24 terminals
26 external connection terminals 28 bumps
32 resin material
34 top cover
40, 44, 48, 52, 56 vibrating bodies
42, 46, 50a to 50c, 54a to 54d, 58a, 58b electrodes
60 sealing material

DETAILED DESCRIPTION OF THE INVENTION

Figure 2:
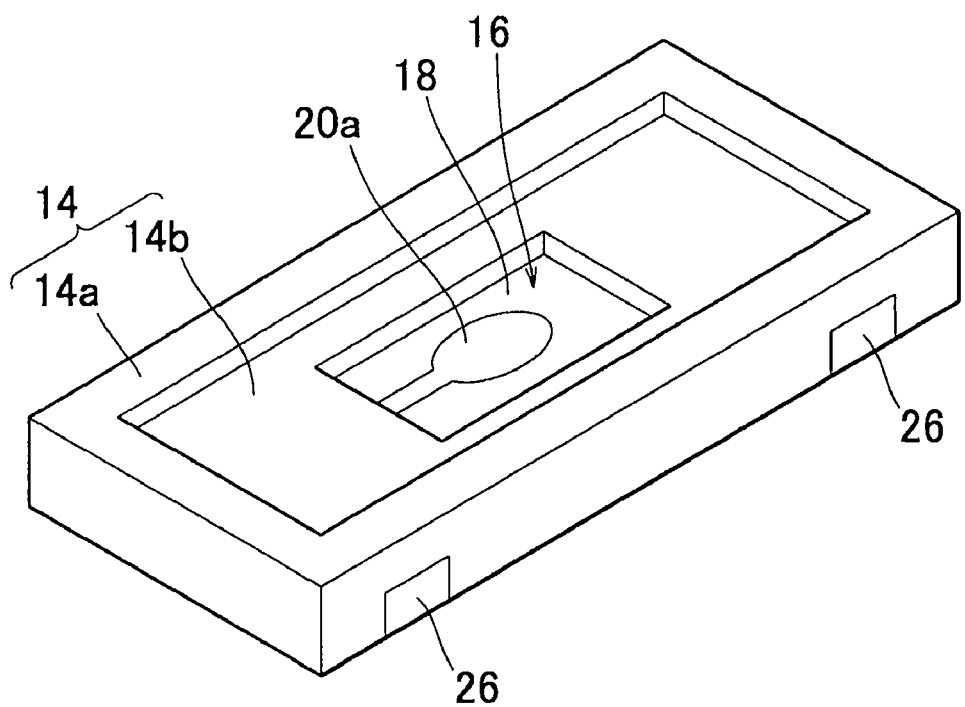
FIG. 2 is a perspective view of the inside of the vibrator module shown in FIG. 1 when viewed from one side.
Figure 3:
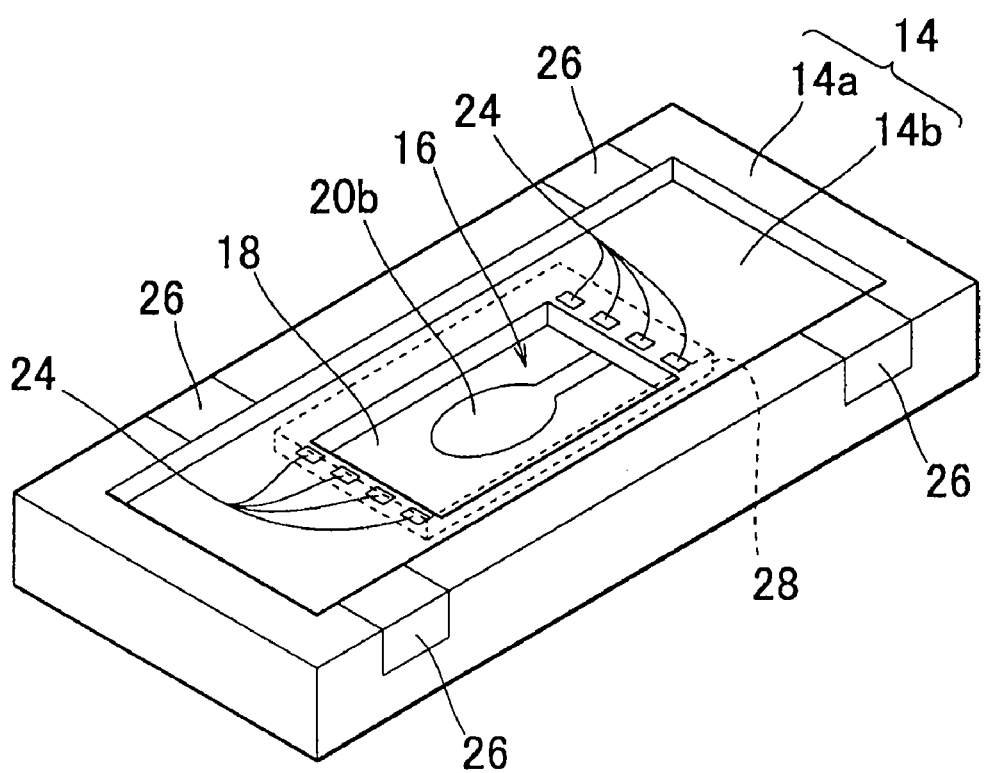
FIG. 3 is a perspective view of the inside of the vibrator module shown in FIG. 1 when viewed from the other side.

FIG. 1 is a cross-sectional view of a vibrator module according to the present invention, showing the vibrator module as an example. A vibrator module 10 includes a frame 12 with a vibrator. The frame 12 with the vibrator includes a frame 14, for example, in the shape of a rectangle as shown in FIGS. 2 and 3. The frame 14 includes an outer frame 14a in the shape of a square ring. Additionally, an inner frame 14b in the shape of a square ring is formed inside the outer frame 14a. The inner frame 14b is thinner than the outer frame 14a, and steps between the inner frame 14b and the outer frame 14a are formed on both surfaces of the inner frame 14b. Accordingly, the inner frame 14b is formed in portions more recessed than the outer frame 14a on both surfaces of the inner frame 14b. The outer frame 14a and the inner frame 14b are formed of, for example a piezoelectric ceramic.

In the central portion of the inner frame 14b, a vibrator unit 16 in the shape of a square plate is formed. The vibrator unit 16 includes a vibrating body 18 thinner than the inner frame 14b, and, on both surfaces of the vibrating body 18, electrodes 20a and 20b are formed. The electrodes 20a and 20b are formed, for example, in the shape of a circle in the central portion of the vibrating body 18, and are formed so as to face each other. The electrodes 20a and 20b lead out in opposite directions, and are formed so as to extend to portions of the inner frame 14b. The vibrating body 18 is polarized in the thickness direction, whereby the vibrator unit 16 serves as a vertical vibrator that vibrates in the thickness direction. It is only necessary that, as a polarization region of the vibrating body 18, at least one portion of the vibrating body 18 corresponding to portions of the electrodes 20a and 20b facing each other be polarized. Any region can be set as the polarization region. It is only necessary that the polarization be performed in the vibrating body 18. The frame 14 does not need to be polarized.

The frame 14 and the vibrating body 18 are molded using a ceramic material and fired together, thereby being formed as one piece. The frame 14 and the vibrating body 18 do not have to be necessarily formed of the same material. For example, the vibrating body 18 may be formed of a piezoelectric ceramic, and the frame 14 may be formed of a dielectric ceramic. In this case, a portion between the vibrating body 18 and the inner frame 14b can be formed of a functionally gradient material.

Figure 4:
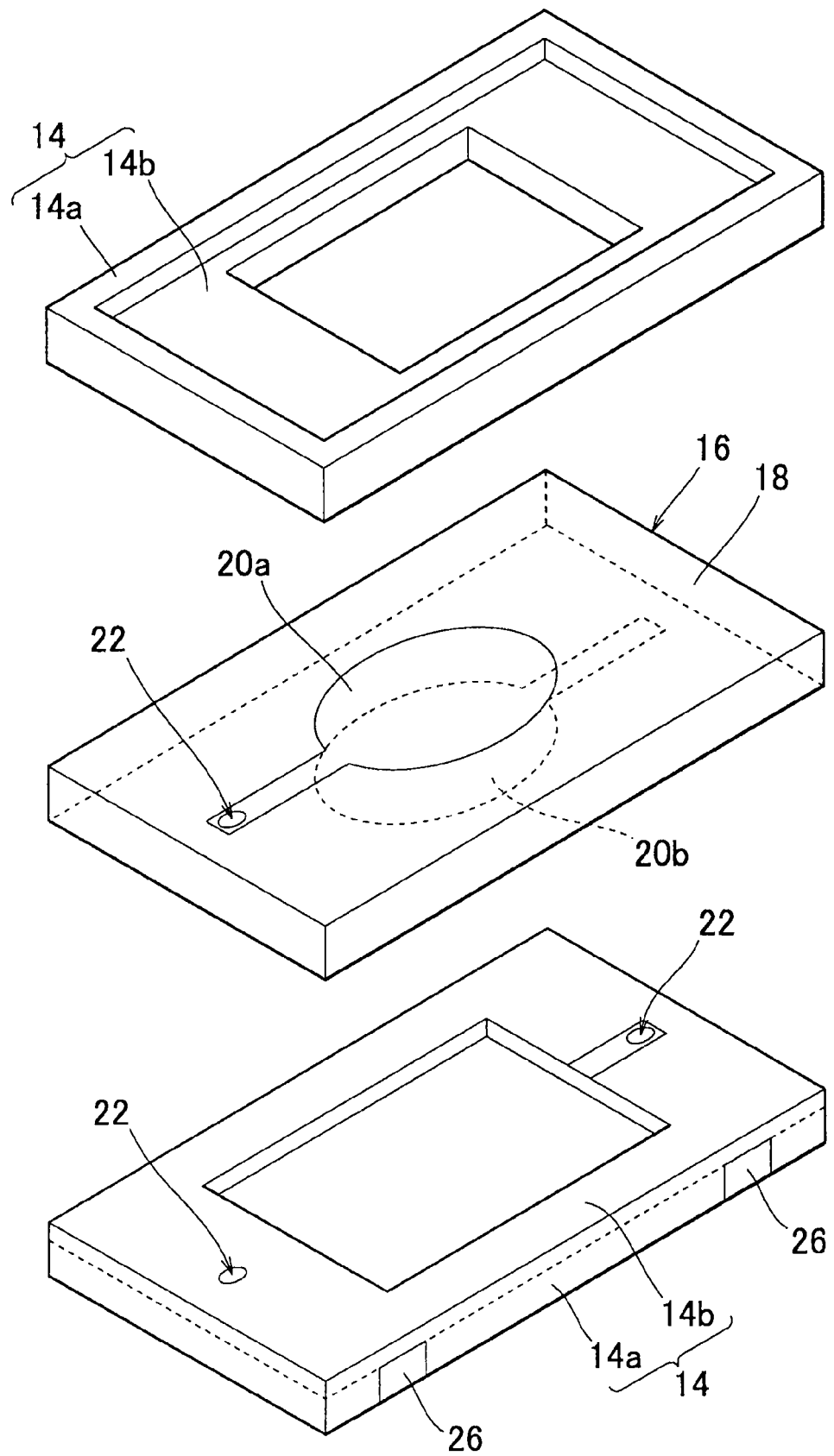
FIG. 4 includes exploded perspective views of an electrode configuration used in the vibrator shown in FIG. 1, showing the electrode configuration as one example.

The electrodes 20a and 20b, which face each other on both surfaces of the vibrating body 18, lead out onto one surface of the inner frame 14b. In order that the electrodes 20a and 20b lead out, for example, as shown in FIG. 4, when the frame 12 with the vibrator is formed, through holes 22, electrodes whose patterns extend from the periphery, and so forth are formed. Via the through holes 22, the electrodes whose patterns extend from the periphery, and so forth, the electrodes 20a and 20b are electrically connected to terminals 24 that are formed on the one surface of the inner frame 14b.

On the inner frame 14b, in addition to the terminals 24 that are connected to the electrodes 20a and 20b of the vibrator unit 16, a plurality of terminals 24 are formed. The terminals 24 are electrically connected to a plurality of external connection terminals 26 that are formed on one surface of the outer frame 14a. The external connection terminals 26 are formed, for example, on portions close to four corners of the outer frame 14a so as to run from one surface of the outer frame 14a to side surfaces of the outer frame 14a.

Regarding formation of the frame 12 with the vibrator, by using a technique such as an imprint molding technique or a technique for stacking layers formed of a ceramic nano-powder using an inkjet method, the precision can be increased to a level higher than that achieved by molding in the related art. Particularly, the vibrator unit 16 is largely responsible for a vibration frequency or a sensor sensitivity in many cases. For this reason, when sufficient precision is not achieved even using the above-mentioned precise molding techniques, adjustment is performed using lift-off means, such as a laser, sandblasting, or an ion beam, or adhesion means.

On one side of the frame 12 with the vibrator, an IC 28 is mounted. Because edges of the IC 28 are disposed on the inner frame 14b, a hollow portion is formed between the vibrator unit 16 and the IC 28. The hollow portion is a region in which the vibrator unit 16 can vibrate. Terminals of the IC 28 and the terminals 24, which are formed on the inner frame 14b, are bonded, for example, by flip-chip bonding using gold bumps 30. In the IC 28, for example, a driving circuit for exciting the vibrator unit 16, and a signal processing circuit for performing processing of a signal output from the vibrator unit 16 are formed. The IC 28 and an external circuit are connected to each other via the external connection terminals 26. Additionally, the inside of the outer frame 14a is filled with a resin material 32 to cover the IC 28.

On the other side of the frame 12 with the vibrator, a top cover 34 serving as a sealing material is disposed on the outer frame 14a. Accordingly, a hollow portion is formed between the top cover 34 and the vibrator unit 16. The hollow portion is a region in which the vibrator unit 16 can vibrate.

The vibrator module 10 is mounted on a circuit board or the like. In this case, the external connection terminals 26 are connected to an external circuit, thereby connecting the IC 28 to the external circuit. The vibrator unit 16 is excited by the IC 28, and the signal output from the vibrator unit 16 is processed by the IC 28.

In the vibrator module 10, because the frame 14 and the vibrator unit 16 are formed as one piece, the frame 12 with the vibrator can be used as a package in which a vibrator is formed in advance. Thus, a high degree of size reduction can be achieved, compared with a case in which a vibrator that has been manufactured separately is to be connected to a package in the related art. No process of bonding a vibrator to a package is necessary, either. Therefore, the manufacturing cost of the vibrator module 10 can be reduced. As described above, by using the imprint molding technique or the technique for stacking layers formed of a ceramic nano-powder using an inkjet method, the frame 12 with the vibrator having a compact and precision shape can be manufactured.

Additionally, because the frame 12 with the vibrator can be manufactured by molding, a region in which the vibrator unit 16 is confined can be formed by molding to determine the size and form of the region. Thus, vibration leakage becomes small, and stable vibration can be obtained. Furthermore, because the polarization region of the vibrator unit 16 can be freely set, even when the frame 12 with the vibrator is manufactured using the same material, the electromechanical coefficient can be adjusted by changing the polarization region. Accordingly, different performances can be obtained by changing the polarization region.

In the vibrator module 10, when the entire frame 12 with the vibrator is formed of a piezoelectric ceramic, there is a case in which it is difficult to connect the frame 12 with the vibrator to an external circuit because the frame 12 with the vibrator is fragile. In order to deal with this problem, as described above, the vibrator unit 16 may be formed of a piezoelectric ceramic, and the frame 14 may be formed of a dielectric ceramic.

Figure 5:
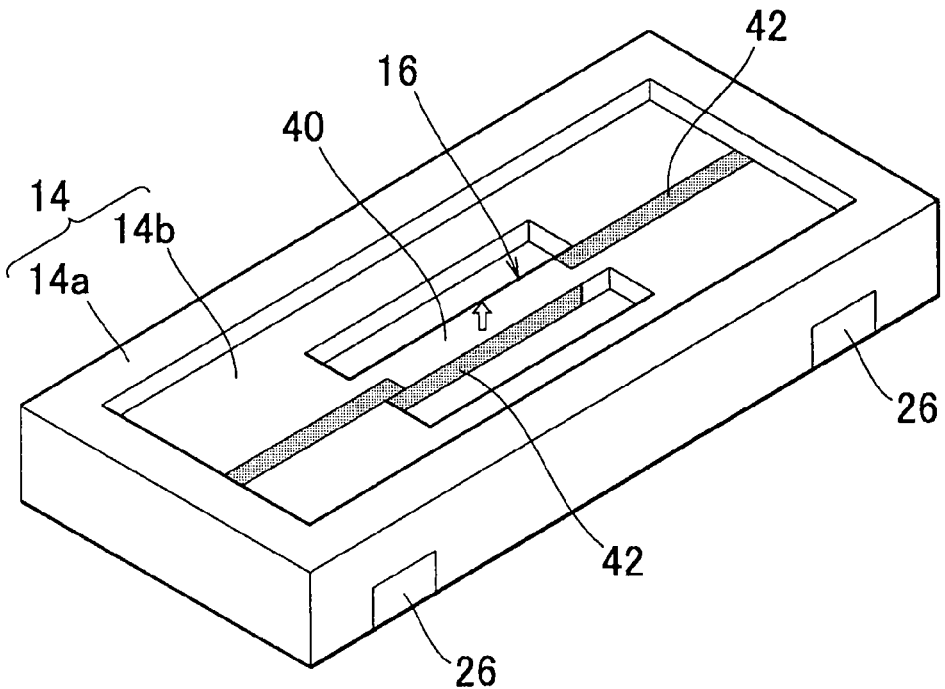
FIG. 5 is a perspective view of a vibrator unit used in the vibrator module according to the present invention, showing the vibrator unit as a modification example.

The vibrator unit 16 does not have to be necessarily designed as a vertical vibrator that vibrates in the thickness direction, and may be designed as a vibrator having another vibration mode. For example, as shown in FIG. 5, through holes may be provided inside the inner frame 14b to form a vibrating body 40 in the shape of a bar. As the arrow shown in FIG. 5 indicates, the vibrating body 40 is polarized in the thickness direction. Electrodes 42 facing each other are formed on side faces that are parallel to the polarization direction of the vibrating body 40. The electrodes 42 lead out in opposite directions. A vibrator unit 16 serves as a sliding vibrator that vibrates in the thickness direction.

Figure 6:
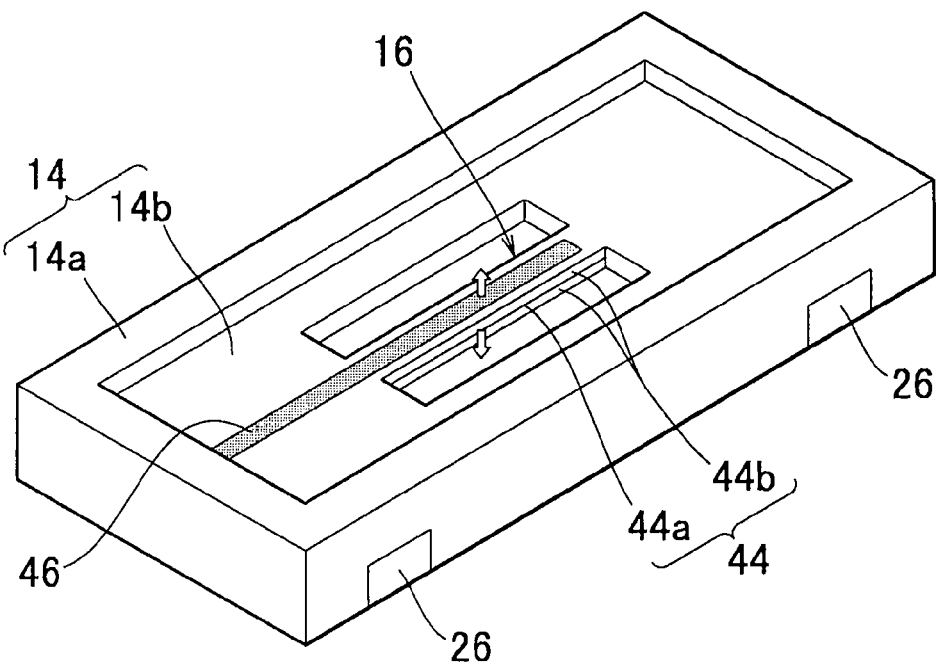
FIG. 6 is a perspective view of a vibrator unit used in the vibrator module according to the present invention, showing the vibrator unit as another modification example.

Additionally, as shown in FIG. 6, a multilayer vibrator 44 may be formed inside the inner frame 14b. The vibrator 44 includes an intermediate electrode 44a in the central portion in the thickness direction, and piezoelectric material layers 44b are formed on both sides of the intermediate electrode 44a. The piezoelectric material layers 44b are polarized, and the polarization directions of piezoelectric material layers 44b are opposite to each other on both sides of the intermediate electrode 44a. Electrodes 46 are formed on surfaces that face each other in a direction in which the intermediate electrode 44a and the piezoelectric material layers 44b are stacked. The electrodes 46 lead out in opposite directions on the inner frame 14b. A vibrator unit 16 serves as a bimorph-type flexural vibrator that vibrates in the thickness direction, in which an excitation signal causes the two stacked piezoelectric material layers 44b to shift in opposite directions, and in which flexural vibration is performed in the thickness direction. The vibrator unit 16 that is formed in this manner serves as a resonator, and as an element also capable of detecting acceleration in the thickness direction.

Figure 7:
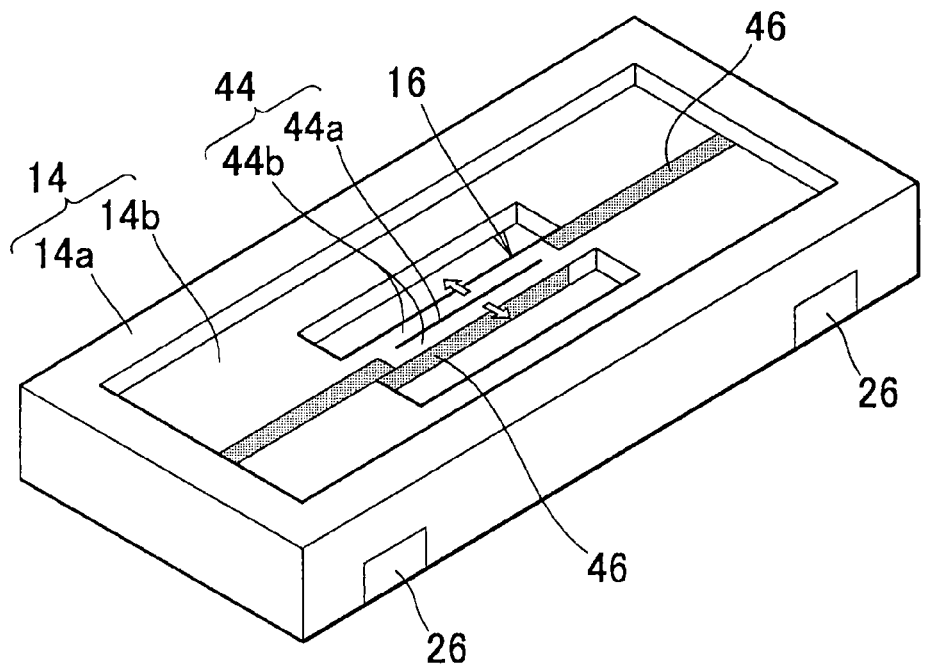
FIG. 7 is a perspective view of a vibrator unit used in the vibrator module according to the present invention, showing the vibrator unit as further another modification example.

Furthermore, when a vibrator unit 16 serving as a bimorph-type flexural vibrator that vibrates in the thickness direction is formed, as shown in FIG. 7, the vibration direction of the vibrator unit 16 may be the width direction of the vibrator unit 16. In this case, in the vibrator unit 16, the intermediate electrode 44a and the piezoelectric material layers 44b are stacked in the width direction of the vibrator unit 16, and the electrodes 46 are formed on surfaces that face each other in the direction in which the intermediate electrode 44a and the piezoelectric material layers 44b are stacked. The polarization directions of the vibrator 44 are opposite to each other on both sides of the intermediate electrode 44a. The vibrator unit 16 that is formed in this manner serves as a resonator, and as an element also capable of detecting acceleration in the thickness direction.

Figure 8:
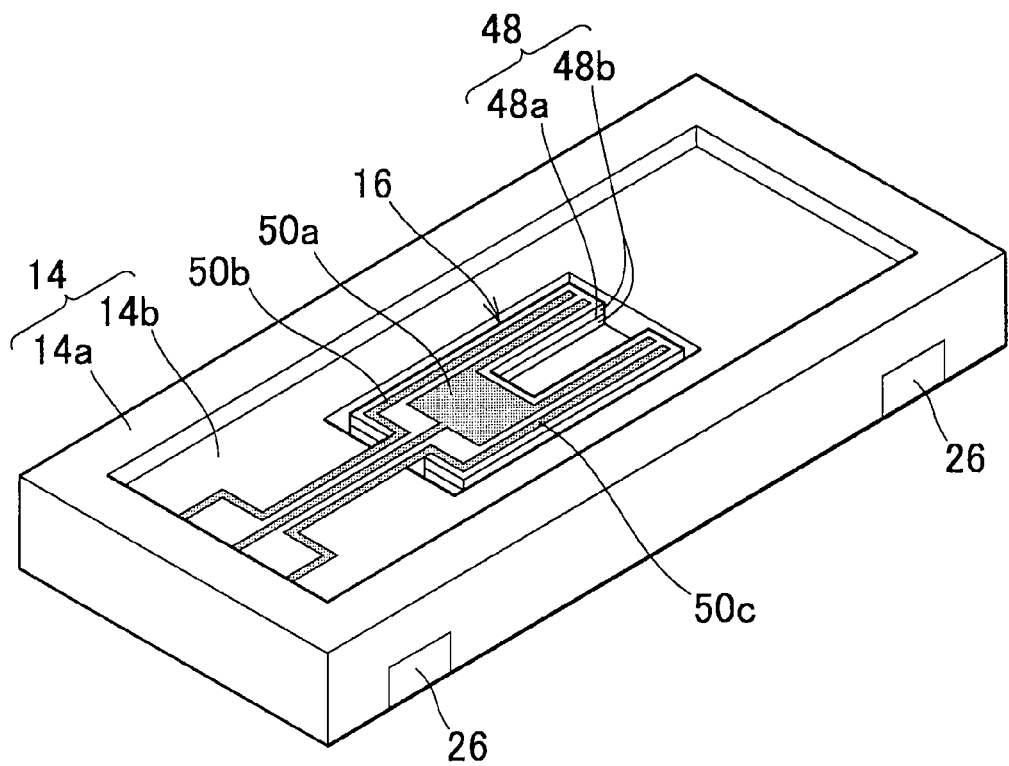
FIG. 8 is a perspective view of a vibrator unit used in the vibrator module according to the present invention, showing the vibrator unit as another modification example.

In addition, as shown in FIG. 8, a tuning-fork-type vibrator unit 16 may be formed. In the vibrator unit 16, a tuning-fork-type vibrating body 48 is formed. A base to which the vibrating body 48 is connected is connected to the inner frame 14b. On one surface of the vibrating body 48, electrodes 50a, 50b, 50c are formed along the shape of the tuning-fork-type vibrating body 48. The electrode 50a is formed in the shape of a tuning fork along the inside of the vibrating body 48. The electrodes 50b and 50c are formed outside the electrode 50a along two legs of the vibrating body 48. An excitation signal is applied between the electrode 50a and the electrodes 50b and 50c, whereby the two legs of the vibrating body 48 vibrate so as to open and close. Accordingly, the vibrating body 48 functions as a resonator. The vibrating body 48 includes an intermediate electrode 48a, and piezoelectric material layers 48b that are stacked on both surfaces of the intermediate electrode 48a. The piezoelectric material layers 48b are polarized, and the polarization directions of the piezoelectric material layers 48b are opposite to each other on both sides of the intermediate electrode 48a. The vibrator unit 16 that is formed in this manner functions as a vibrator unit used in an angular velocity sensor capable of measuring a Coriolis force by detecting a vibration in the vertical direction from vibrations caused by opening and closing of a tuning fork when an object has an angular velocity of rotation.

Figure 9:
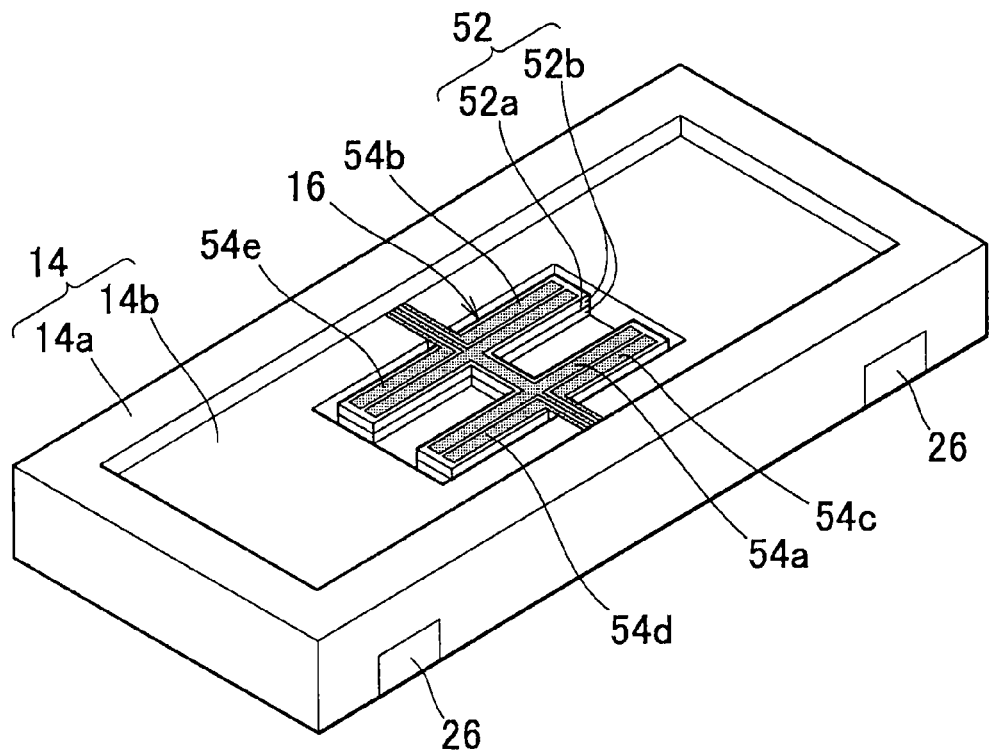
FIG. 9 is a perspective view of a vibrator unit used in the vibrator module according to the present invention, showing the vibrator unit as further another modification example.

Furthermore, as shown in FIG. 9, an H-shaped tuning-fork-type vibrator unit 16 may be formed. In the vibrator unit 16, an H-shaped tuning-fork-type vibrating body 52 is formed. The central portion of the vibrating body 52 in the longitudinal direction is connected to the inner frame 14b on both sides of the vibrating body 52 in the width direction. On one surface of the vibrating body 52, electrodes 54a, 54b, 54c, 54d, and 54e are formed along the shape of the H-shaped tuning-fork-type vibrating body 52. The electrode 50a is formed in the shape of an H-shaped tuning fork along the inside of the vibrating body 52. Additionally, the electrodes 54b and 54c are formed outside the electrode 54a along two legs on one side of the vibrating body 52. Additionally, the electrodes 54d and 54e are formed outside the electrode 54a along two legs on the other side of the vibrating body 52. An excitation signal is applied between the electrode 54a and the electrodes 54b and 54c, and between the electrode 54a and the electrodes 54d and 54e, whereby the legs on both sides of the vibrating body 52 vibrate so as to open and close. Accordingly, the vibrating body 52 functions as a resonator. The vibrating body 52 includes an intermediate electrode 52a, and piezoelectric material layers 52b that are stacked on both surfaces of the intermediate electrode 52a. The piezoelectric material layers 52b are polarized, and the polarization directions of the piezoelectric material layers 52b are opposite to each other on both sides of the intermediate electrode 52a. The vibrator unit 16 that is formed in this manner functions as a vibrator unit used in an angular velocity sensor capable of measuring a Coriolis force by detecting a vibration in the vertical direction from vibrations caused by the H-shaped open legs when an object has an angular velocity of rotation.

Figure 10:
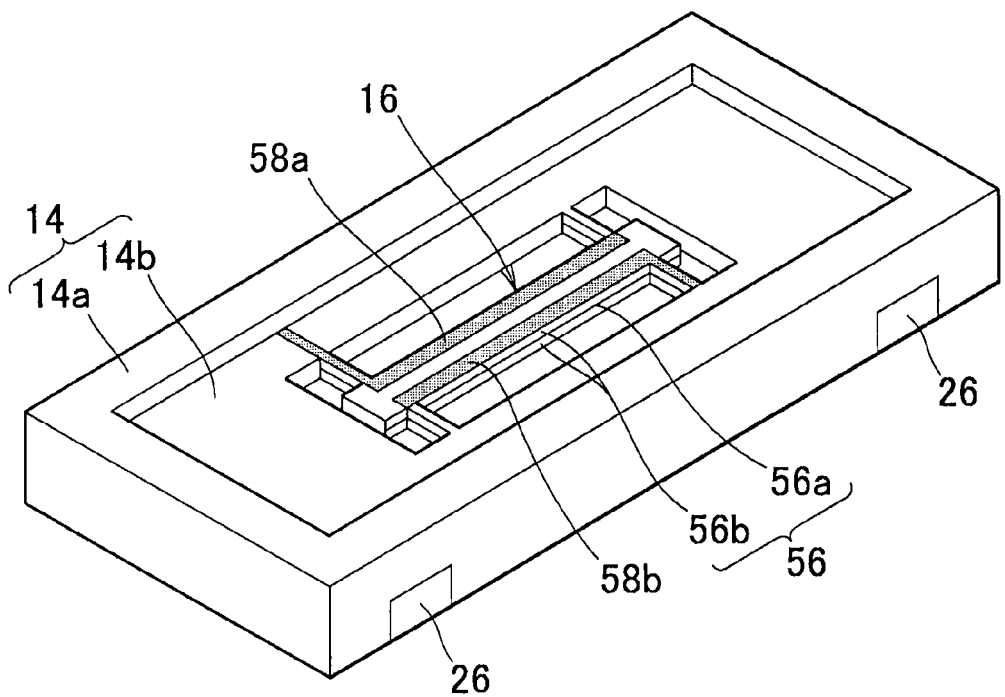
FIG. 10 is a perspective view of a vibrator unit when the vibrator module according to the present invention is used as a vibrating gyroscope, showing the vibrator unit as one example.

Additionally, as shown in FIG. 10, as a vibrator unit 16, a bimorph-type tuning-bar-type flexural vibrator is formed, and the vibrator module may be used as a vibrating gyroscope. The vibrator unit 16 includes a vibrating body 56 in the shape of a bar. The vibrating body 56 in the shape of a bar has a configuration in which piezoelectric material layers 56b and 56c are stacked on both sides of an intermediate electrode 56a. The piezoelectric material layers 56a and 56b are polarized, and the polarization directions of the piezoelectric material layers 56a and 56b are opposite to each other on both sides of the intermediate electrode 56a. The ends of the vibrating body 56 in the longitudinal direction are opened, and the vibrating body 56 is connected to the frame 14 at portions corresponding to nodes at which the vibrating body 56 performs flexural vibration.

On one surface of the vibrating body 56, two electrodes 58a and 58b are formed, which are divided in the width direction, and which extend in the longitudinal direction. The electrodes 58a and 58b lead out onto the inner frame 14b via connection portions. On the other surface of the vibrating body 56, a full-surface electrode is formed. An excitation signal is applied between the full-surface electrode and the electrodes 58a and 58b, whereby the vibrating body 56 performs flexural vibration in the thickness direction. In this case, portions in which the electrodes 58a and 58b are formed are in the same vibration state, and signals having the same characteristics are output from the electrodes 58a and 58b. Accordingly, when the difference between the output signal from the electrode 58a and the output signal from the electrode 58b is calculated, the difference is output as zero.

In this vibration state, when the vibrating body 56 rotates at an angular velocity of rotation whose center is provided in an axis direction, the vibration direction of the vibrating body 56 is changed by a Coriolis force. The change in the vibration direction causes the difference between signals output from the electrodes 58a and 58b. When the difference between the output signals from the electrodes 58a and 58b is calculated, a signal corresponding to the Coriolis force can be obtained. In this manner, the vibrator module 10 in which the vibrator unit 16 is formed can be used as a vibrating gyroscope for detecting an angular velocity of rotation.

As described above, as the vibrator unit 16, vibrator units having various types of shapes and vibration modes may be used. A shape and vibration mode of the vibrator unit 16 is appropriately selected, whereby a vibrator module that is suitable for any of applications such as oscillators or various types of sensors can be obtained.

Figure 11:
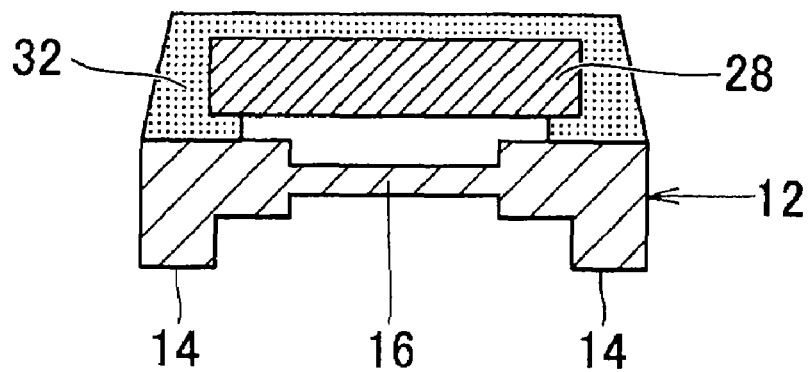
FIG. 11 is a view of a disposition of components of the vibrator module according to the present invention, showing the disposition as one example.

As a configuration in which the IC 28 and so forth are mounted in the frame 12 with the vibrator, for example, as shown in FIG. 11, a configuration may be also used, in which the IC 28 is mounted on one side of the frame 12 with the vibrator, and in which the periphery of the IC 28 is only sealed with the resin material 32. This is the simplest configuration, and is suitable for a process of covering an IC chip on a multi-board with a resin and cutting the resin.

Figure 12:
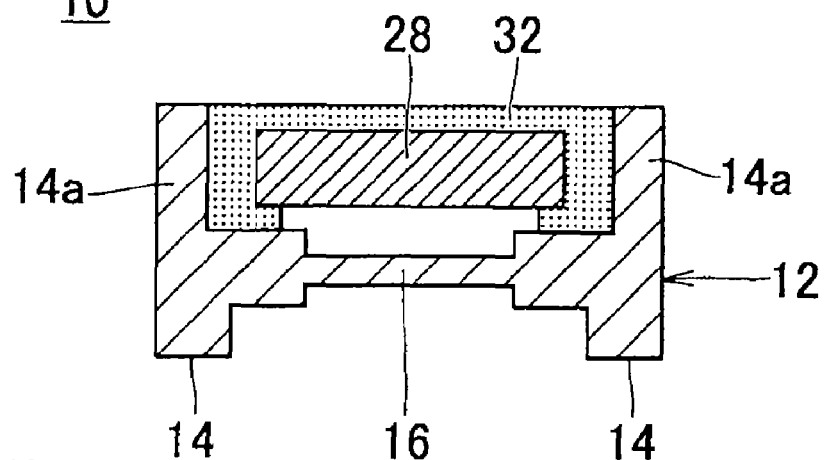
FIG. 12 is a view of a disposition of components of the vibrator module according to the present invention, showing the disposition as another example.

Additionally, as shown in FIG. 12, a higher portion of the outer frame 14a may be provided on one side of the frame 12 with the vibrator, the IC 28 may be accommodated inside the higher portion, and the higher portion may be sealed with the resin material 32. Because, in such a configuration, the resin material 28 is confined in the frame 12 with the vibrator, the configuration can be used also for the frame 12 with the vibrator that is individually fired.

Figure 13:
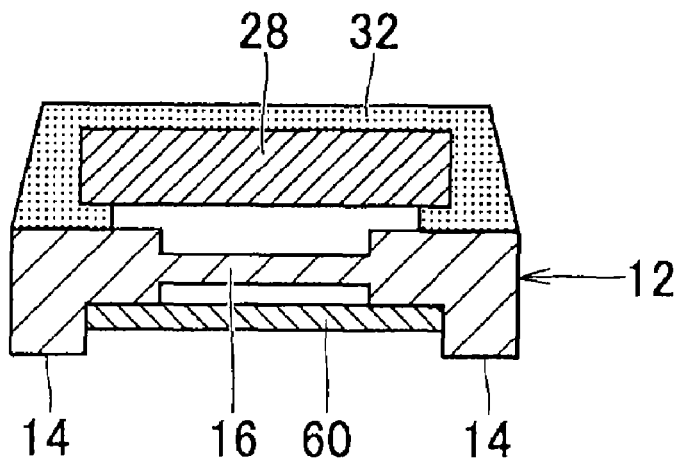
FIG. 13 is a view of a disposition of components of the vibrator module according to the present invention, showing the disposition as further another example.

Furthermore, as shown in FIG. 13, a configuration may be used, in which the IC 28 is disposed on one side of the frame 12 with the vibrator and is sealed with the resin material 32, and in which the other side of the frame 12 with the vibrator is sealed with a sealing material 60. In a vibrator module 10 having such a configuration, the other side of the frame 12 with the vibrator is sealed with the sealing material 60, and the sealing material 60 also serves as a damper that avoids vibration leakage.

Figure 14:
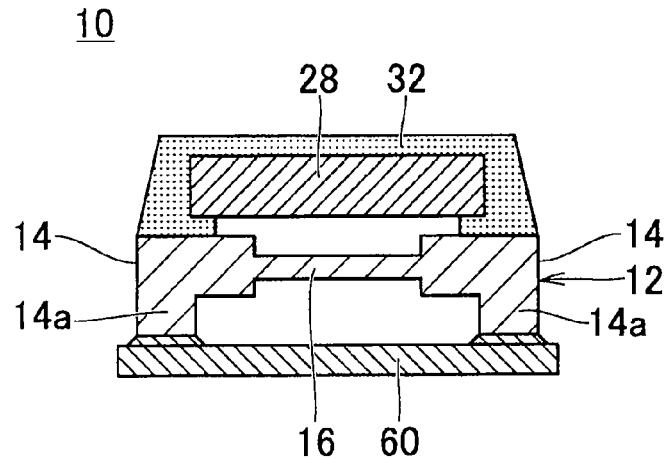
FIG. 14 is a view of a disposition of components of the vibrator module according to the present invention, showing the disposition as another example.

In addition, as shown in FIG. 14, the IC 28 is disposed on one side of the frame 12 with the vibrator, and is sealed with the resin material 32. The sealing material 60 is formed on the other side of the frame 12 with the vibrator so as to cover the outer frame 14a. In a vibrator module 10 having such a configuration, the other side of the frame 12 with the vibrator is sealed with the sealing material 60, and, at the same time, a buffer effect of avoiding a damage of ceramic due to heat shock can be obtained by the sealing material 60.

Figure 15:
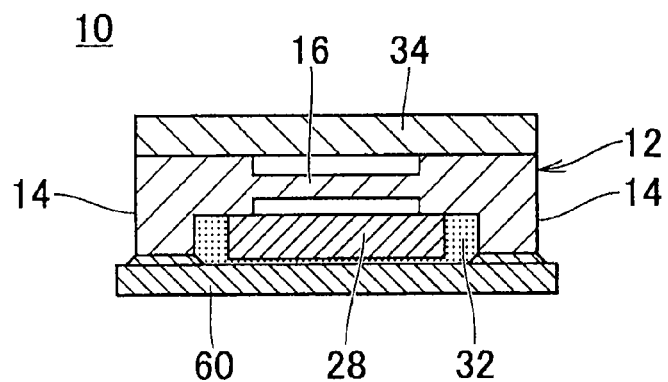
FIG. 15 is a view of a disposition of components of the vibrator module according to the present invention, showing the disposition as further another example.

Moreover, as shown in FIG. 15, one side of the frame 12 with the vibrator may be sealed with the top cover 34. The IC 28 may be accommodated in the other side of the frame 12 with the vibrator, and be sealed with the resin material 32. On the resin material 32, the sealing material 60 may be formed. In a vibrator module 10 having such a configuration, because the IC 28 is disposed on the bottom surface of the frame 12 with the vibrator, the frame 12 with the vibrator can be sealed after the vibrator unit 16 is adjusted by excitation.

Figure 16:
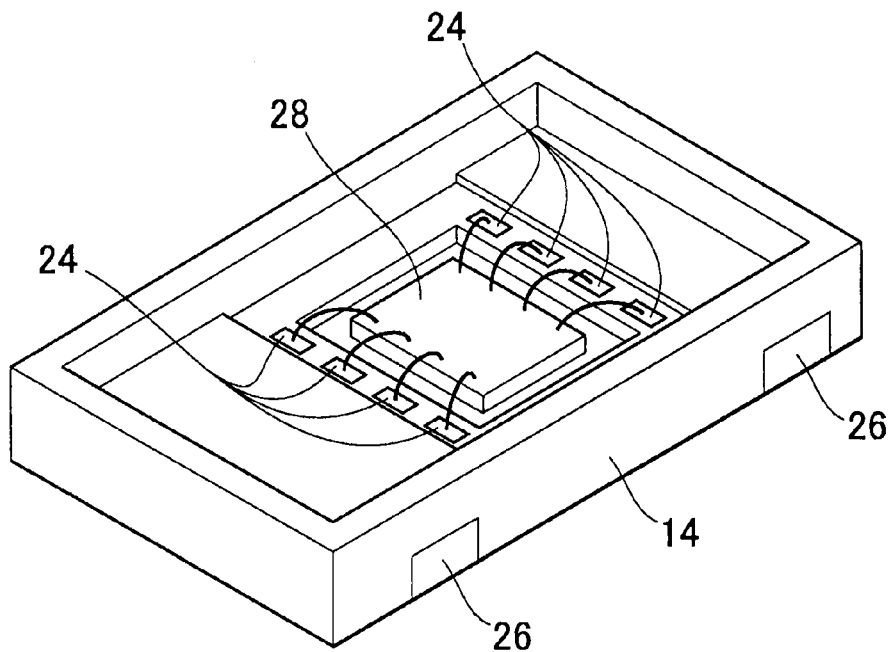
FIG. 16 is a view showing a connection state of an IC used in the vibrator module according to the present invention as one example.
Figure 17:
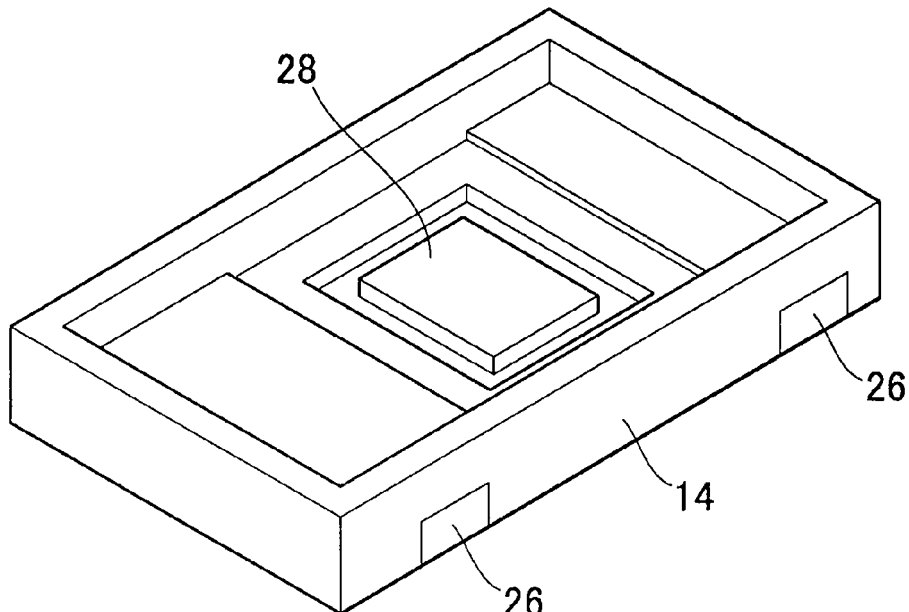
FIG. 17 is a view showing a connection state of the IC used in the vibrator module according to the present invention as another example.
Figure 18:
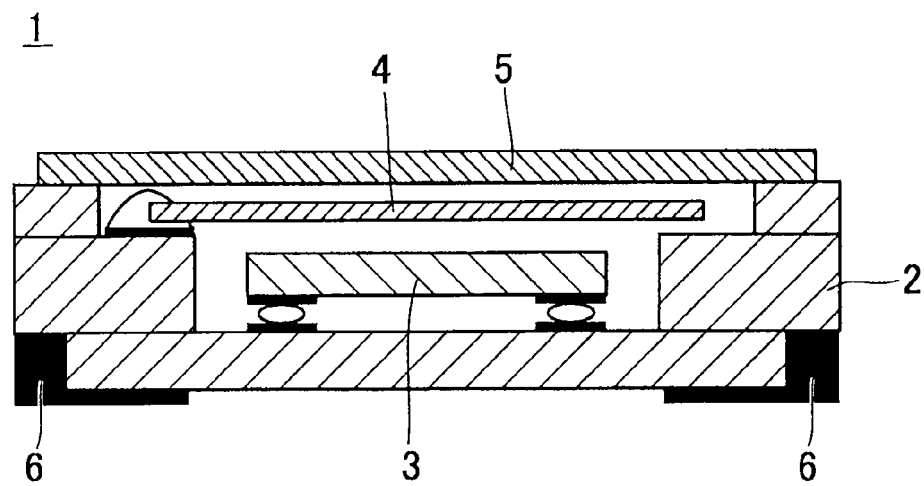
FIG. 18 is a cross-sectional view of a vibrator module in the related art, showing the vibrator module as an example.
Figure 19:
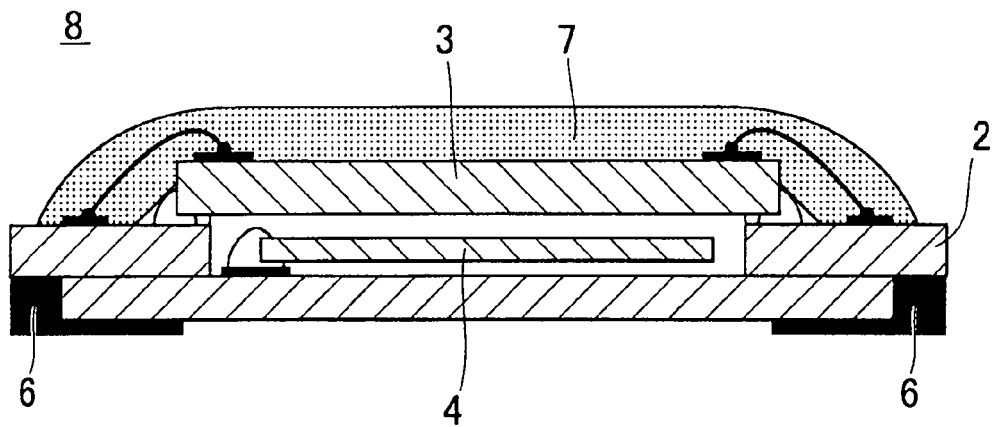
FIG. 19 is a cross-sectional view of a vibrator module in the related art, showing the vibrator module as another example.

Additionally, regarding a method for bonding the terminals of the IC 28 and the terminals 24 of the frame 12 to the vibrator, the terminals of the IC 28 and the terminals 24 may be bonded by wire bonding as shown in FIG. 16, or may be bonded by flip-chip bonding as shown in FIG. 17. Therefore, the IC 28, the resin material 32, the sealing material 60, and so forth can be disposed in various ways. Any connection method for the IC 28 can be selected.

Also in the vibrator module 10 configured in any of the above-described manners, because the frame 14 and the vibrator unit 16 are formed as one piece, the frame 12 with the vibrator can be used as a package. Thus, the size of the frame 12 with the vibrator can be reduced. Additionally, no process of bounding a vibrator to the frame 14 in a case in which the vibrator is separately formed is necessary. Therefore, the manufacturing cost of the vibrator module 10 can be reduced.

The invention claimed is:

1. A vibrator module comprising:
a frame;
a piezoelectric ceramic vibrator unit positioned inside and integral with the frame;
an IC mounted in the frame so that a hollow portion is formed between the IC and the vibrator unit; and
an electrode on the vibrator unit electrically connected to the IC.

2. The vibrator module according to claim 1, wherein the frame is a dielectric ceramic frame, and a portion between the vibrator unit and the dielectric ceramic frame is a functionally gradient material.

3. The vibrator module according to claim 1, wherein the frame includes an outer frame and an inner frame inside the outer frame, the vibrator unit being integral with the inner frame.

4. The vibrator module according to claim 3, wherein the inner frame is thinner than the outer frame.

5. The vibrator module according to claim 4, wherein the vibrator unit is thinner than the inner frame.

6. The vibrator module according to claim 1, further comprising a terminal located on the frame and electrically connected to the electrode of the vibrator unit, and wherein the terminal and the IC are bonded by one of flip-chip bonding and wire bonding.

7. The vibrator module according to claim 1, wherein the IC is disposed on a first side of the vibrator unit, and a sealing material with which the vibrator unit is sealed is located in the frame on a second side of the vibrator unit opposite the IC so that a second hollow portion is formed between the sealing material and the vibrator unit.

8. The vibrator module according to claim 1, wherein the vibrator unit includes a vibrating body in the shape of a bar.

9. The vibrator module according to claim 1, wherein the vibrator unit includes a vibrating body in a tuning fork shape.

10. The vibrator module according to claim 1, wherein the vibrator unit includes a vibrating body having multiple layers.

11. The vibrator module according to claim 10, wherein the vibrating body is in the shape of a bar.

12. The vibrator module according to claim 10, wherein the vibrating body is in a tuning fork shape.

13. The vibrator module according to claim 10, further comprising an intermediate electrode located between two of the multiple layers of the vibrating body.

14. The vibrator module according to claim 1, further comprising a resin material covering the IC.

15. The vibrator module according to claim 14, further comprising a sealing material covering the resin material.

* * * * *